(12) United States Patent
Seo et al.

(10) Patent No.: US 9,532,462 B2
(45) Date of Patent: Dec. 27, 2016

(54) PRINTED CIRCUIT BOARD AND MANUFACTURING METHOD THEREOF

(75) Inventors: Yeong Uk Seo, Seoul (KR); Sung Woon Yoon, Seoul (KR); Jin Su Kim, Seoul (KR); Myoung Hwa Nam, Seoul (KR); Sang Myung Lee, Seoul (KR); Chi Hee Ahn, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 560 days.

(21) Appl. No.: 13/512,271

(22) PCT Filed: Nov. 25, 2010

(86) PCT No.: PCT/KR2010/008372
§ 371 (c)(1),
(2), (4) Date: Dec. 17, 2012

(87) PCT Pub. No.: WO2011/065757
PCT Pub. Date: Jun. 3, 2011

(65) Prior Publication Data
US 2013/0112463 A1    May 9, 2013

(30) Foreign Application Priority Data
Nov. 25, 2009    (KR) .................... 10-2009-0114286

(51) Int. Cl.
*H05K 1/00* (2006.01)
*H05K 1/09* (2006.01)
(Continued)

(52) U.S. Cl.
CPC .............. *H05K 3/101* (2013.01); *H05K 1/02* (2013.01); *H05K 1/0353* (2013.01); *H05K 1/092* (2013.01);
(Continued)

(58) Field of Classification Search
CPC ........ H05K 1/0353; H05K 1/092; H05K 3/02; H05K 3/101; H05K 3/244; H05K 2201/09518; H05K 3/007; H05K 3/103; H05K 1/183; H05K 2201/09472; H05K 2201/09827; H05K 2201/09381; H05K 2201/09509; H05K 2201/09563; Y10T 29/49155; H01L 2224/48224
(Continued)

(56) References Cited

U.S. PATENT DOCUMENTS 4,581,301 A * 4/1986 Michaelson .................... 29/840
4,707,394 A * 11/1987 Chant .................... H05K 3/107
174/257
(Continued)

FOREIGN PATENT DOCUMENTS

| CN | 10-1449633 A | 6/2009 |
| JP | H06-224529 A | 8/1994 |

(Continued)

OTHER PUBLICATIONS

Office Action dated Jan. 14, 2013 in Taiwanese Application No. 099140549, filed Nov. 24, 2010.
(Continued)

*Primary Examiner* — Chau N Nguyen
*Assistant Examiner* — Roshn Varghese
(74) *Attorney, Agent, or Firm* — Saliwanchik, Lloyd & Eisenschenk

(57) ABSTRACT

The present invention provides a structure of a printed circuit board and a manufacturing method thereof. The method includes: (a) forming a circuit pattern on an insulating layer in which a seed layer is formed; (b) embedding the circuit pattern into the insulating layer by a press method; and (c) removing the seed layer. According to the present invention, a fine pattern may be formed without (Continued)

occurring alignment problem by forming a circuit pattern directly on an insulating layer and reliability of the formed fine pattern may be increased by performing a process of embedding protruded circuits into the insulating layer. In addition, possibility of inferior circuit occurring due to ion migration between adjacent circuits may be reduced by performing over-etching a circuit layer to be lower than a surface of the insulating layer during the etching process of removing a seed layer.

17 Claims, 5 Drawing Sheets

(51) Int. Cl.
    *H05K 3/10* (2006.01)
    *H05K 3/20* (2006.01)
    *H05K 1/02* (2006.01)
    *H05K 1/03* (2006.01)
    *H05K 3/02* (2006.01)

(52) U.S. Cl.
    CPC *H05K 3/20* (2013.01); *H05K 3/02* (2013.01); *H05K 3/108* (2013.01); *H05K 2201/0376* (2013.01); *H05K 2203/0278* (2013.01)

(58) Field of Classification Search
    USPC .................................... 174/250, 257, 258
    See application file for complete search history.

(56) References Cited

U.S. PATENT DOCUMENTS

| | | | |
|---|---|---|---|
| 4,718,993 A * | 1/1988 | Cupta et al. ................ | 361/748 |
| 7,332,212 B2 * | 2/2008 | Foster et al. ................ | 174/258 |
| 2001/0013425 A1 * | 8/2001 | Rokugawa et al. ......... | 174/262 |
| 2002/0119251 A1 * | 8/2002 | Chen ....................... | C25D 5/02 |
| | | | 427/256 |
| 2008/0052905 A1 * | 3/2008 | Watanabe ............ | H05K 3/0014 |
| | | | 29/846 |
| 2008/0098596 A1 * | 5/2008 | Kim ........................ | H05K 3/20 |
| | | | 29/831 |
| 2008/0098597 A1 * | 5/2008 | Jung .................... | H05K 3/0058 |
| | | | 29/846 |
| 2008/0115355 A1 * | 5/2008 | Park ....................... | H05K 1/115 |
| | | | 29/852 |
| 2008/0257596 A1 * | 10/2008 | Kaneko ............... | H01L 21/4857 |
| | | | 29/842 |
| 2008/0264676 A1 * | 10/2008 | Okabe .................... | H05K 1/116 |
| | | | 174/250 |
| 2008/0264684 A1 | 10/2008 | Kang et al. | |
| 2008/0315431 A1 * | 12/2008 | Ahn ....................... | H01L 23/13 |
| | | | 438/667 |
| 2009/0183901 A1 | 7/2009 | Kataoka et al. | |
| 2009/0194318 A1 | 8/2009 | Yeon et al. | |
| 2009/0314525 A1 * | 12/2009 | Kajino et al. ............... | 174/255 |
| 2010/0270057 A1 * | 10/2010 | Yanagimoto ........... | H05K 3/107 |
| | | | 174/250 |

FOREIGN PATENT DOCUMENTS

| | | |
|---|---|---|
| JP | H07-321461 A | 12/1995 |
| JP | H1174625 A | 3/1999 |
| JP | 2001036200 A | 2/2001 |
| JP | 2002-204043 A | 7/2002 |
| JP | 2003-060355 A | 2/2003 |
| JP | 2006-173650 A | 6/2006 |
| JP | 2008-047655 A | 2/2008 |
| KR | 10-0689018 B1 | 3/2007 |
| KR | 10-2008-0096985 A | 11/2008 |
| KR | 10-2009-0042668 A | 4/2009 |
| KR | 10-2009-0085240 A | 8/2009 |
| TW | 200843578 A | 11/2008 |

OTHER PUBLICATIONS

International Search Report in International Application No. PCT/KR2010/008372, filed Nov. 25, 2010.

Office Action dated Apr. 5, 2016 in Japanese Application No. 2015-18442.

* cited by examiner

PRINTED CIRCUIT BOARD AND MANUFACTURING METHOD THEREOF

CROSS-REFERENCE TO RELATED APPLICATIONS

This application is the U.S. national stage application of International Patent Application No. PCT/KR2010/008372, filed Nov. 25, 2010, which claims priority to Korean Application No. 10-2009-0114286, filed Nov. 25, 2009, the disclosures of each of which are incorporated herein.

TECHNICAL FIELD

The present invention relates to a printed circuit board having a structure in which a circuit pattern is embedded in a board and a manufacturing method thereof.

BACKGROUND ART

A printed circuit board is made by printing circuit lines on an electrical insulating board using conductive material such as copper and indicates a circuit board in a state directly before electronic parts are mounted on. That is, a circuit board in which mounting locations of the electronic parts are fixed and in which circuit lines for connecting various kinds of electronic parts are printed on a planar surface.

In general, the printed circuit board is manufactured by photo-lithography process with high productivity and cheap manufacturing cost. There are several methods of manufacturing the printed circuit board using the photo-lithography process such as subtractive process and semi-additive process (SAP).

FIG. 1 illustrates an example of the subtractive process.

In detail, the subtractive process is performed by (a) forming a metal layer 2 on an insulating layer 1, (b) forming patterns 3 of photosensitive material by exposing and developing the photosensitive material after coating photosensitive material on the metal layer 2, (c) etching the patterns, and (d) forming a circuit pattern 4 by removing the photosensitive material 3.

FIG. 2 illustrates an example of the SAP.

In detail, the SAP is performed by (a) forming a seed layer 12 on an insulating layer 11, (b) patterning 13 by coating photosensitive material on the seed layer 12, (c) forming electroless copper plating layer 14, (d) removing the photosensitive material 13, and (e) removing the seed layer 12. In the SAP, as illustrated in FIG. 3, the circuit pattern 14 may be formed on a desired location with respect to the alignment.

However, since circuits of the printed circuit board manufactured by the subtractive process and the SAP do not have an even surface of the insulating layer, there is a limit of forming a fine pattern. Low illuminance of a surface including the insulating material is advantageous in order to form the fine pattern. However, in this case, contact between the insulating layer and the photosensitive material becomes poor and has a negative effect on forming a circuit due to delamination occurring during a series of processes of forming the circuit. When illuminance is high, contact between the photosensitive material and a base material is improved. However, since fine Cu may easily remain in rough insulating material during the process of removing a final seed layer after the plating and the delamination of photosensitive material, there is a strong possibility of electrical short. Since etchant permeates the under layer of the circuit and it makes forming the shape of the circuit difficult, the high illuminance has a negative effect on forming fine pattern with high reliability.

Therefore, in order to realize a fine pattern, a special method must be required because of the negative relationship between illuminance of the insulating material and the capability of realizing a fine pattern with reliability.

As a method of solving the limitation for the fine pattern, it is considered a method of embedding a circuit by forming a pattern shape of the circuit on a series of carrier substrate including a surface of a metal layer and an insulating layer for supporting the metal layer, by turning the carrier boards such that the circuit faces the insulating material, and by pressing the circuit.

FIG. 4 illustrates an example of a process of embedding a circuit pattern in the insulating layer.

The process is performed by (a) forming a carrier board 21 including a seed layer 22, (b) coating and patterning 23 a photosensitive material, (c) filling a metal material to form a circuit pattern 24, (d) removing the photosensitive material 23, (e) aligning the circuit pattern 24 to face the insulating layer 25 and laminating, (f) pressing the aligned circuit pattern, (g) removing the carrier board 21, and (h) removing the seed layer 22.

DISCLOSURE OF INVENTION

Technical Problem

However, since the embedding method of the circuit pattern is complicated and may cause a trouble for the alignment when the circuit 24 is embedded in the insulating layer 25, the circuit pattern 24 may be not embedded at a desired position as illustrated in FIG. 5. In addition, there are problems such as high cost and low productivity of process.

Solution to Problem

The problems to be solved by the present invention are as follows.

An aspect of the present invention provides a printed circuit board on which a fine pattern can be formed without occurring alignment problem by forming a circuit pattern on an insulating layer like existing semi-additive process and on which the fine pattern of high reliability can be formed by performing a series of processes including a process of embedding protruded circuits into the insulating layer in order to improve reliability of the formed fine pattern, and a manufacturing method thereof.

Another aspect of the present invention provides a printed circuit board capable of reducing possibility of inferior circuit occurring by ion migration between adjacent circuits by performing over-etching a circuit layer to be lower than a surface during the etching process of removing a seed layer after embedding the circuit, and a manufacturing method thereof.

In accordance with an exemplary embodiment of the present invention, there is provided a method of manufacturing a printed circuit board, including (a) forming a circuit pattern on an insulating layer in which a seed layer is formed; (b) embedding the circuit pattern into the insulating layer by a press method; and (c) removing the seed layer so that a fine pattern of reliability can be formed.

Particularly, the step (a) includes: (a-1) forming the seed layer on the insulating layer; (a-2) coating a photosensitive material on the seed layer to be patterned by an exposure process and a developing process; (a-3) filling a metallic material in the patterned photosensitive material layer to form the circuit pattern; and (a-4) removing the patterned photosensitive material.

In addition, the seed layer in the (a-1) step is a metal layer including at least one of copper (Cu), gold (Au), nickel (Ni), palladium (Pd), indium (In), titanium (Ti), and tin (Sn), a conductive polymer using alkene such as aniline, pyrrole, thiophene, and acetylene and derivatives thereof as monomer, or a polymer complex including metal particles and ions, or includes at least one of carbons such as graphite, carbon nanotube, and carbon black and inorganic materials such as indium (In), tin (Sn), and titanium dioxide ($TiO_2$).

The step (a-3) is a method of filling the metallic material and at least one of an electroless plating, an electroplating, a screen printing, a dispensing, an ink spraying method, and a dry method, and the metallic material in the step (a-3) includes at least one of copper (Cu), silver (Ag), tin (Sn), gold (Au), nickel (Ni), and palladium (Pd).

The press method in the step (b) is at least one of a press method of applying heat and pressure at the same time, a press method using ultrasonic waves, or a press method using thermal laser.

The method may further includes (d) over-etching after the step (c) such that height of the embedded circuit is lower than the surface of the insulating layer so that ion migration between adjacent circuit is prevented to reduce possibility of inferior circuit.

In accordance with an exemplary embodiment of the present invention, there is also provided, a printed circuit board comprising a circuit pattern embedded into an insulating layer such that the surface of the circuit pattern is exposed to height lower than the surface of the insulating layer, so that a reliable fine pattern may be formed and ion migration may be prevented to reduce inferior circuit.

Advantageous Effects of Invention

According to an exemplary embodiment of the present invention, a fine pattern may be formed without occurring alignment problem by forming a circuit pattern directly on an insulating layer and high density and high reliability of the formed fine pattern may be formed by performing a process of embedding protruded circuits into the insulating layer in order to increase reliability of the formed fine pattern.

In addition, possibility of inferior circuit occurring due to ion migration between adjacent circuits may be reduced by adding a process of over-etching a circuit layer to be lower than a surface of the insulating layer during the etching process of removing a seed layer, and possibility of an inferior circuit caused by the ion migration may be reduced.

The foregoing and other objects, features, aspects and advantages of the present invention will become more apparent from the following detailed description of the present invention when taken in conjunction with the accompanying drawings.

BEST MODE FOR CARRYING OUT THE INVENTION

Figure 1:
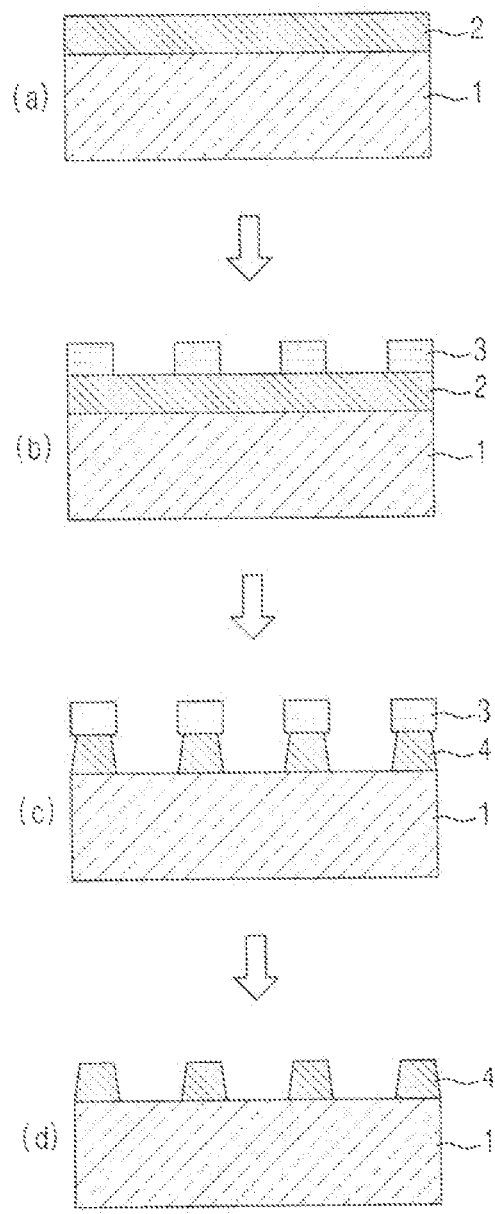
FIGS. 1A-1D and 2A-2E are views illustrating manufacturing process of a printed circuit board according to the conventional art.
Figure 2:
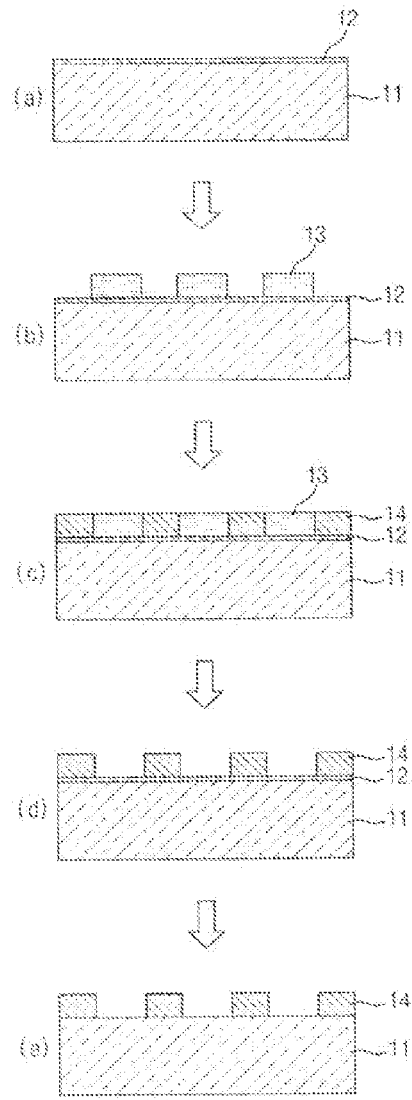
Figure 3:
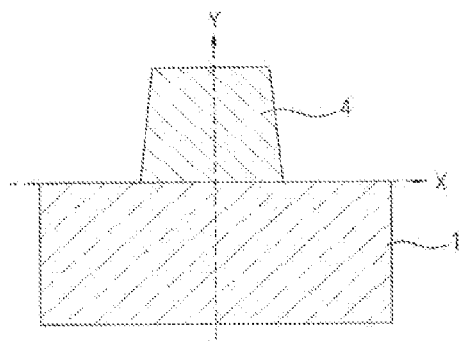
FIG. 3 is a sectional view illustrating an alignment of a part of a circuit pattern formed by the conventional semi-additive process.
Figure 4:
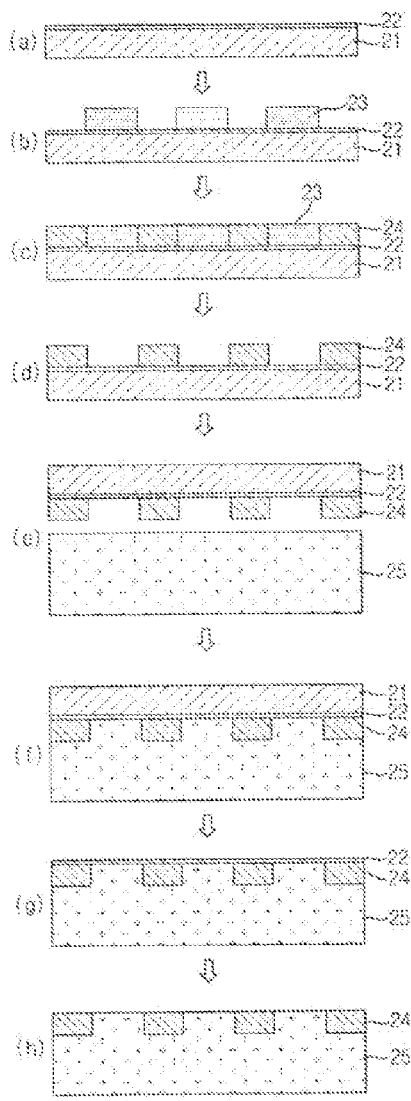
FIGS. 4A-4H is a view illustrating a manufacturing process of a printed circuit board by the conventional circuit embedding method.

In accordance with an exemplary embodiment of the present invention, there is provided a method of manufacturing a printed circuit board, including (a) forming a circuit pattern on an insulating layer in which a seed layer is formed; (b) embedding the circuit pattern into the insulating layer by a press method; and (c) removing the seed layer so that a fine pattern of reliability can be formed.
Mode for the Invention The terminology used herein is for the purpose of describing particular embodiments only and is not intended to be limiting of the invention.

The present invention may be embodied in many different forms and may have various embodiments, of which particular ones will be illustrated in drawings and will be described in detail. However, it should be understood that the following exemplifying description of the invention is not meant to restrict the invention to specific forms of the present invention but rather the present invention is meant to cover all modifications, similarities and alternatives which are included in the spirit and scope of the present invention. Therefore, shapes of elements illustrated in the drawings are exaggerated for the clear understanding and similar numerals are assigned to similar elements.

Figure 6:
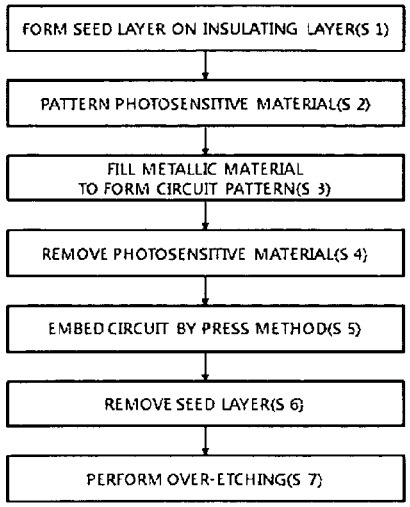
FIG. 6 is a flowchart of a printed circuit board manufacturing method according to an embodiment of the present invention.
Figure 7:
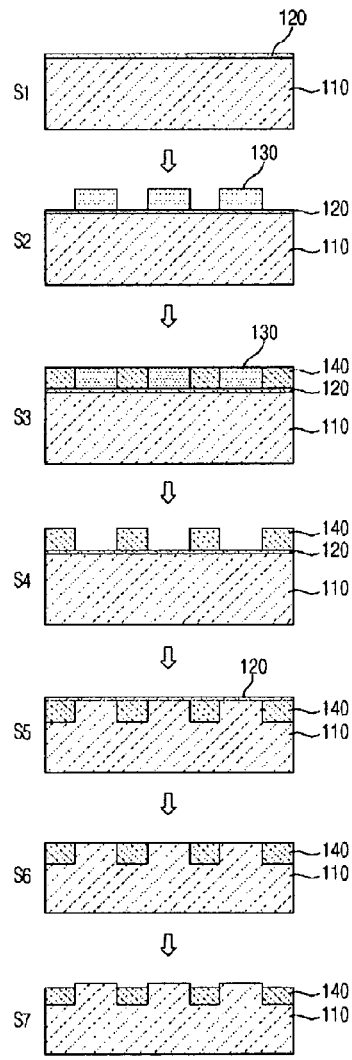
FIG. 7 is a sectional view illustrating a manufacturing flowchart of a printed circuit board manufacturing method corresponding to the flowchart of FIG. 6.

FIGS. 6 and 7 illustrate a flowchart and a manufacturing flowchart of a detailed manufacturing process according to the present invention.

The present invention provides a printed circuit board manufacturing method including: (a) forming a circuit pattern on an insulating layer on which a seed layer is formed; (b) embedding the circuit pattern into the insulating layer by a pressing method; and (c) removing the seed layer and a printed circuit board capable of forming a fine pattern without the alignment problem by forming the circuit pattern directly on a desired insulating layer and of increasing reliability of the fine pattern by including a process of embedding a protruded circuit into the insulating layer.

In detail, in step S1, a thin metal film of a seed layer 120 is formed on an insulating layer 110. When a substrate including the seed layer 120 or a part of the seed layer 120 and the substrate is punched, a via hole may be formed. The seed layer 120 may be a metal layer including at least one of copper (Cu), gold (Au), nickel (Ni), palladium (Pd), indium (In), titanium (Ti), and tin (Sn), or a conductive polymer using alkene such as aniline, pyrrole, thiophene, and acetylene and derivatives thereof as monomer. In addition, the seed layer 120 may include at least one of carbons such as graphite, carbon nanotube, and carbon black and inorganic materials such as indium (In), tin (Sn), and titanium dioxide (TiO2) as well as may be polymer complex including metal particles and ions.

In step S2, photosensitive material is coated on the seed layer 120 and the coated seed layer 120 is patterned. In this case, the photosensitive material coated on the seed layer 120 may be formed into a desired pattern 130 by an exposure process and a development process.

After that, in step S3, the desired pattern 140 is formed by filling metal in the patterned photosensitive material layer 130. In this case, the metal may include at least one of copper (Cu), silver (Ag), tin (Sn), gold (Au), nickel (Ni), and palladium (Pd). In addition, the method of filling the metal may be one of an electroless plating, an electroplating, a screen printing, a dispensing, an ink spraying method, and a dry method. There are several dry methods such as sputter and evaporation.

In step S4, the photosensitive material 130 is removed and only the desired circuit pattern 140 remains on the seed layer 120. The circuit pattern 140 remains protruding from the substrate.

In step S5, the protruded circuit pattern is embedded into the insulating layer 110 by a press method. In this case, the press method may be a press method of applying heat and pressure at the same time, using ultrasonic waves, or using thermal laser.

In step S6, when the seed layer 120 on the insulating layer 110 is removed, a printed circuit board in which the circuit pattern 140 is embedded into the insulating layer 110 may be provided. As such, since the circuit pattern 140 can be formed at a desired position by forming the circuit pattern 140 directly on the insulating layer 110 like the existing semi-additive process, the alignment problem that may occur when the circuit is embedded does not occur. This is illustrated in FIG. 8.

After that, the printed circuit board manufacturing method may further include a step of over-etching the circuit pattern 140 such that the circuit pattern 140 is lower than the insulating layer 110 in step S7. By performing the over-etching, the possibility of inferior circuit occurring due to ion migration between adjacent circuits can be reduced.

Figure 8:
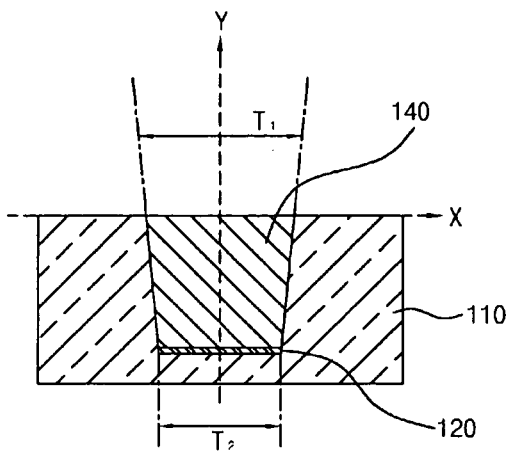
FIGS. 8 and 9 are sectional views illustrating alignments of a part of a circuit pattern formed according to the present invention.
Figure 9:
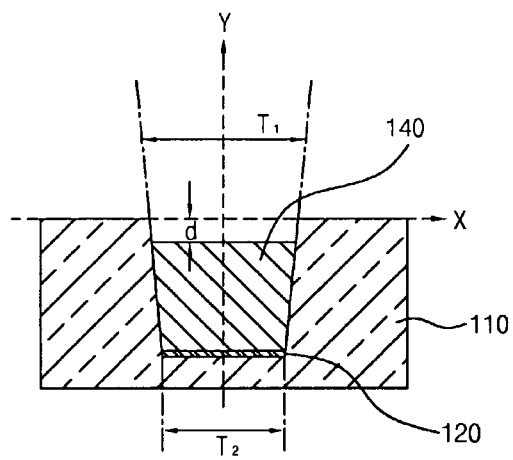

FIG. 8 shows a printed circuit board manufactured by embedding the circuit pattern 140. FIG. 9 is a sectional view of a part of the printed circuit board manufactured by adding the over-etching process of over-etching the circuit pattern 140 to be lower than the insulating layer 110.

Referring to FIGS. 8 and 9, the printed circuit board manufactured by the manufacturing process according to the present invention includes the circuit board 140 embedded into the insulating layer 110, wherein the surface of the circuit pattern 140 is exposed lower than the surface of the insulating layer 110. That is, since the printed circuit board has a structure made by forming the seed layer on the insulating layer, by directly forming the circuit pattern on the seed layer, and by pressing the circuit pattern to be embedded, a basic circuit pattern is realized under the surface of the insulating layer. When the above-mentioned over-etching process is added, the surface of the circuit pattern is exposed to the outside to height lower than the surface of the insulating layer by a step d.

Due to the process peculiarity, a diameter $T_1$ of the exposed surface of the circuit pattern is greater than a diameter $T_2$ of the lower surface of the circuit pattern. That is, a predetermined part of the upper portion has a great diameter by the pressure applied from the upper portion so that overall shape of the circuit pattern has a shape tapered from the upper surface to the lower surface.

In addition, due to the peculiarity of the manufacturing process according to the present invention, since the seed layer is formed, the circuit pattern is formed on the seed layer, and the embedding is performed directly after that, the seed layer must be embedded into the insulating layer in the lower surface of the circuit pattern.

Therefore, as illustrated in FIGS. 8 and 9, the circuit pattern is realized in the structure in which the seed layer 120 exists in the lower surface of the circuit pattern 140.

In this case, the circuit pattern 140 may be made of one or at least two of copper (Cu), silver (Ag), tin (Sn), gold (Au), nickel (Ni), and palladium (Pd) and the seed layer may be made of the same material as those of the circuit pattern.

On the contrary, when the thin seed layer formed in the lower surface of the circuit pattern is made of a material different from those of the circuit pattern, the seed layer may be made of a conductive polymer using alkene such as aniline, pyrrole, thiophene, and acetylene and derivatives thereof as monomer.

Otherwise, when the thin seed layer is realized in the lower surface of the circuit pattern, the seed layer may be made of a polymer complex including metal particles and ions or at least one of carbons such as graphite, carbon nanotube, and carbon black and inorganic materials such as indium (In), tin (Sn), and titanium dioxide ($TiO_2$).

Figure 5:
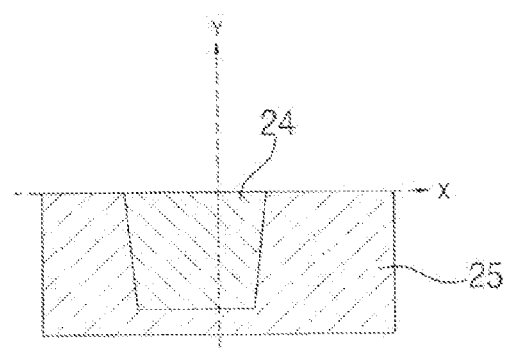
FIG. 5 is a sectional view illustrating an alignment of a part of a circuit pattern formed by the method of FIG. 4.

In the conventional method of forming a circuit pattern on a carrier substrate in advance and applying a pressure against an insulating layer to embed the circuit pattern, the circuit pattern cannot be formed, as illustrated in FIG. 5, at a desired position, the alignment problem occurs. However, in the printed circuit board realized by the distinct characteristics of the manufacturing process according to the present invention, the circuit pattern 140 is formed directly on the insulating layer 110 to be embedded, the circuit pattern 140 can be embedded at a desired position as illustrated in FIGS. 8 and 9 so that the alignment problem of a circuit can be solved.

While the invention has been shown and described with respect to the embodiments, it will be understood by those skilled in the art that various changes and modifications may be made without departing from the scope of the invention as defined in the following claims.

The invention claimed is:

1. A method of manufacturing a printed circuit board, the method comprising:
   (a) forming a circuit pattern on an insulating layer, wherein a seed layer is formed between the circuit pattern and the insulating layer;
   (b) embedding the circuit pattern and the seed layer into the insulating layer by a press method such that the seed layer is embedded only at a lower surface of the circuit pattern, and the embedded circuit pattern comprises a top surface with a diameter greater than a diameter of a bottom surface and lateral surfaces directly contacting the insulating layer without contacting a surface of the seed layer; and
   (c) removing the seed layer;
   wherein the seed layer is made of a material different from that of the circuit pattern, and
   wherein the seed layer comprises a top surface having a diameter same as a diameter of the bottom surface of the embedded circuit pattern and lateral surfaces directly contacting the insulating layer without contacting a surface of the embedded circuit pattern.

2. The method of claim 1, wherein the step (a) comprises:
   (a-1) forming the seed layer on the insulating layer;

(a-2) coating a photosensitive material on the seed layer to be patterned by an exposure process and a developing process;

(a-3) filling a metallic material in the patterned photosensitive material layer to form the circuit pattern; and (a-4) removing the patterned photosensitive material.

3. The method of claim 2, wherein the seed layer in the (a-1) step is a metal layer including at least one of copper (Cu), gold (Au), nickel (Ni), palladium (Pd), indium (In), titanium (Ti), and tin (Sn).

4. The method of claim 2, wherein the seed layer in the step (a-1) is a conductive polymer using alkene such as aniline, pyrrole, thiophene, and acetylene and derivatives thereof as monomer.

5. The method of claim 2, wherein the seed layer in the step (a-1) is a polymer complex including metal particles and ions.

6. The method of claim 2, wherein the seed layer in the step (a-1) includes at least one of carbons such as graphite, carbon nanotube, and carbon black and inorganic materials such as indium (In), tin (Sn), and titanium dioxide ($TiO_2$).

7. The method of claim 2, wherein the step (a-3) is a method of filling the metallic material and at least one of an electroless plating, an electroplating, a screen printing, a dispensing, an ink spraying method, and a dry method.

8. The method of claim 2, wherein the metallic material in the step (a-3) includes at least one of copper (Cu), silver (Ag), tin (Sn), gold (Au), nickel (Ni), and palladium (Pd).

9. The method of claim 2, wherein the press method in the step (b) is at least one of a press method of applying heat and pressure at the same time, a press method using ultrasonic waves, or a press method using thermal laser.

10. The method of claim 1, further comprising (d) over-etching after the step (c) such that height of the embedded circuit is lower than the surface of the insulating layer.

11. A printed circuit board comprising:

a circuit pattern embedded in an insulating layer such that the surface of the circuit pattern is exposed to height lower than the surface of the insulating and such that the embedded circuit pattern comprises a top surface with a diameter greater than a diameter of a bottom surface and lateral surfaces directly contacting the insulating layer without contacting a surface of the seed layer, wherein the entire top surface of the embedded circuit pattern is exposed to outside without overlapping a surface of the insulating layer, wherein a seed layer is embedded only at a lower surface of the circuit pattern, wherein the seed layer is made of a material different from that of the circuit pattern, and wherein the seed layer comprises a top surface having a diameter same as a diameter of the bottom surface of the embedded circuit pattern and lateral surfaces directly contacting the insulating layer without contacting a surface of the embedded circuit pattern.

12. The printed circuit board of claim 11, wherein the circuit pattern is realized by a shape tapered from an upper surface to a lower surface.

13. The printed circuit board of claim 12, wherein the circuit pattern is made of one or at least two of copper (Cu), silver (Ag), tin (Sn), gold (Au), nickel (Ni), and palladium (Pd).

14. The printed circuit board of claim 12, wherein the seed layer includes at least one of copper (Cu), gold (Au), nickel (Ni), palladium (Pd), indium (In), titanium (Ti), and tin (Sn).

15. The printed circuit board of claim 12, wherein the seed layer is a conductive polymer using alkene such as aniline, pyrrole, thiophene, and acetylene and derivatives thereof as monomer.

16. The printed circuit board of claim 12, wherein the seed layer is a polymer complex including metal particles and ions.

17. The printed circuit board of claim 12, wherein the seed layer is made of at least one of graphite, carbon nanotube, and carbon black and indium (In), tin (Sn), and titanium dioxide ($TiO_2$).

* * * * *